United States Patent
Chen et al.

(10) Patent No.: US 10,843,919 B2
(45) Date of Patent: Nov. 24, 2020

(54) MICROELECTROMECHANICAL SYSTEM APPARATUS WITH HEATER

(71) Applicant: INDUSTRIAL TECHNOLOGY RESEARCH INSTITUTE, Hsinchu (TW)

(72) Inventors: Peng-Jen Chen, Kaohsiung (TW); Bor-Shiun Lee, New Taipei (TW); Chao-Ta Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/369,965

(22) Filed: Mar. 29, 2019

(65) Prior Publication Data
US 2020/0209175 A1 Jul. 2, 2020

(30) Foreign Application Priority Data
Dec. 28, 2018 (TW) .............................. 107147611 A (51) Int. Cl.
*B81B 7/00* (2006.01)
*G01N 27/12* (2006.01)
*B81B 3/00* (2006.01)

(52) U.S. Cl.
CPC .......... *B81B 7/0096* (2013.01); *B81B 3/0081* (2013.01); *B81B 7/009* (2013.01);
(Continued)

(58) Field of Classification Search
CPC ..... B81B 7/0083; B81B 7/0087; B81B 7/009; B81B 7/00936; B81B 2203/01;
(Continued)

(56) References Cited

U.S. PATENT DOCUMENTS 6,137,206 A 10/2000 Hill
6,161,421 A 12/2000 Fang et al.
(Continued)

FOREIGN PATENT DOCUMENTS

TW 446819 B 7/2001
TW 479399 B 3/2002
(Continued)

OTHER PUBLICATIONS

Taiwanese Office Action issued in corresponding application No. 107147611, dated Apr. 29, 2019.
(Continued)

*Primary Examiner* — Eduardo A Rodela
(74) *Attorney, Agent, or Firm* — Maschoff Brennan (57) ABSTRACT

A MEMS apparatus with heater includes central part, periphery part, gap and first connecting part. Central part includes center of mass, heater and first joint. Heater is disposed inside central part. First joint is located on boundary of central part. Displacement of first joint is produced when central part is heated by heater. Periphery part surrounds central part. Gap surrounds central part, and is located between central part and periphery part. First connecting part connects central part and periphery part along first reference line and includes first inner connecting portion and first outer connecting portion. First inner connecting portion is connected to first joint. First outer connecting portion is connected to periphery part. First reference line passes through first joint, and first reference line is not parallel to line connecting center of mass and first joint.

14 Claims, 9 Drawing Sheets

(52) U.S. Cl.
CPC .......... *B81B 7/0083* (2013.01); *B81B 7/0087* (2013.01); *G01N 27/123* (2013.01); *G01N 27/128* (2013.01)

(58) Field of Classification Search
CPC ..... B81B 2203/0109; B81B 2203/0118; B81B 2201/0235; B81B 3/00; B81B 3/0018; B81B 3/0021; B81B 3/0027; B81B 3/0035; B81B 3/0062; B81B 3/0064; B81B 3/0081; H01L 2224/81234; H01L 2924/1461
See application file for complete search history.

(56) References Cited

U.S. PATENT DOCUMENTS

| | | | |
|---|---|---|---|
| 6,759,261 B2* | 7/2004 | Shimokohbe | B81C 1/00682 438/48 |
| 7,800,279 B2 | 9/2010 | Yang | |
| 7,963,147 B2 | 6/2011 | Jun et al. | |
| 8,683,847 B2 | 4/2014 | Moon et al. | |
| 9,182,366 B2 | 11/2015 | Izawa et al. | |
| 9,494,543 B2 | 11/2016 | Moon et al. | |
| 2008/0134753 A1 | 6/2008 | Jun et al. | |
| 2012/0297860 A1 | 11/2012 | Izawa et al. | |
| 2014/0169924 A1* | 6/2014 | Golda | H01L 24/75 414/752.1 |
| 2014/0183669 A1* | 7/2014 | Xu | G01C 19/5656 257/415 |
| 2017/0288125 A1* | 10/2017 | Glacer | H02N 1/006 |
| 2018/0052124 A1* | 2/2018 | Rogers | G01N 25/18 |

FOREIGN PATENT DOCUMENTS

| | | |
|---|---|---|
| TW | 200636235 A | 10/2006 |
| TW | 200643408 A | 12/2006 |
| TW | I275789 B | 3/2007 |
| TW | I283297 B | 7/2007 |
| TW | 200728605 A | 8/2007 |
| TW | 200819740 A | 5/2008 |
| TW | I314645 B | 9/2009 |
| TW | 201432234 A | 8/2014 |
| TW | I452287 B | 9/2014 |
| TW | I600899 B | 10/2017 |
| TW | 201830001 A | 8/2018 |

OTHER PUBLICATIONS

Fabrication of highly sensitive and selective H2 gas sensor based on SnO2 thin film sensitized with microsized Pd islands, NguyenVan Toan, NguyenViet Chien, NguyenVan Duy, HoangSi Hong, HugoNguyen, NguyenDuc Hoa, Journal of Hazardous Materials, Jan. 2016, vol. 301, 15, pp. 433-442.

"Micro-machined gas sensor array based on metal film microheater, Yaowu Mo, Yuzo Okawa, Motoshi Tajima, Takehito Nakai, Nobuyuki Yoshiike, Kazuki Natukawa, Sensors and Actuators B: Chemical, Oct. 2001, vol. 79, Issues 2-3, 15, pp. 175-181".

Pt-doped SnO2 thin film based micro gas sensors with high selectivity to toluene and HCHO, Jun-gu Kang, Joon-ik Park, Hoo-Jeong Lee, Sensors and Actuators B: Chemical, Sep. 2017, vol. 248, pp. 1011-1016.

* cited by examiner

MICROELECTROMECHANICAL SYSTEM APPARATUS WITH HEATER

CROSS-REFERENCE TO RELATED APPLICATIONS

This non-provisional application claims priority under 35 U.S.C. § 119(a) on Patent Application No(s). 107147611 filed in Taiwan, R.O.C. on Dec. 28, 2018, the entire contents of which are hereby incorporated by reference.

TECHNICAL FIELD

The disclosure relates to a Microelectromechanical system (MEMS) apparatus with heater, and a MEMS apparatus with heater that is less affected by the thermal stress.

BACKGROUND

To enhance the measurement accuracy, the MEMS sensor and the surrounding thereof would be heated to a specific temperature prior to the operation of the MEMS sensor. Generally, the MEMS sensor is disposed on and corresponding to a heating device embedded in a circuit board so that the MEMS can be heated by the heating device.

SUMMARY

The disclosure provides a MEMS apparatus with heater that is less affected by the thermal stress to avoid the unexpected deformation thereof, thereby having improved reliability and accuracy.

One embodiment of this disclosure provides a MEMS apparatus with heater including a central part, a periphery part, a gap and a first connecting part. The central part includes a center of mass, a heater and a first joint. The heater is disposed in the central part. The first joint is located on a boundary of the central part. A displacement of the first joint is produced when the central part is heated by the heater. The periphery part surrounds the central part. The gap surrounds the central part, and the gap is located between the central part and the periphery part. The first connecting part connects the central part and the periphery part along a first reference line and includes a first inner connecting portion and a first outer connecting portion. The first inner connecting portion is connected to the first joint. The first outer connecting portion is connected to the periphery part. The first reference line passes through the first joint, and the first reference line is not parallel to a first connecting line that connects the center of mass and the first joint.

The above summary and the following detailed descriptions of the disclosure are exemplary used to illustrate the principle and the spirit of the disclosure, and provide a further explanation of the claims of the disclosure.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

In the appending drawings, the size, ratio and angle may be exaggerated for the propose of explanation, but the disclosure is not limited thereto. Various modifications may be embodied without departing from the spirit of the disclosure. The orientations or positions described in the embodiments and the drawings are used for explanation rather than being used for limiting the disclosure.

Figure 1A:
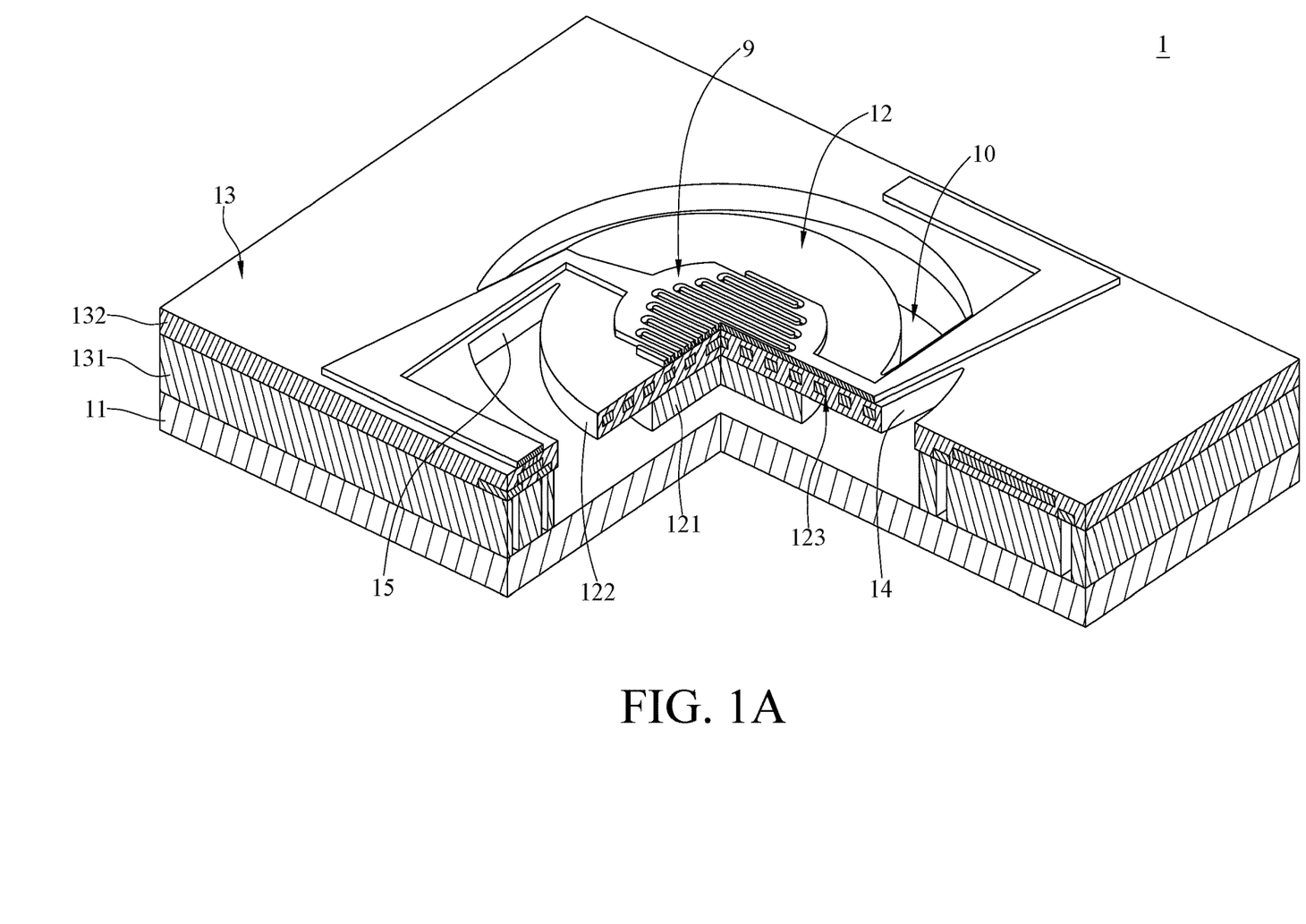
FIG. 1A is a cross-sectional view of a MEMS apparatus according to one embodiment of the disclosure.
Figure 1B:
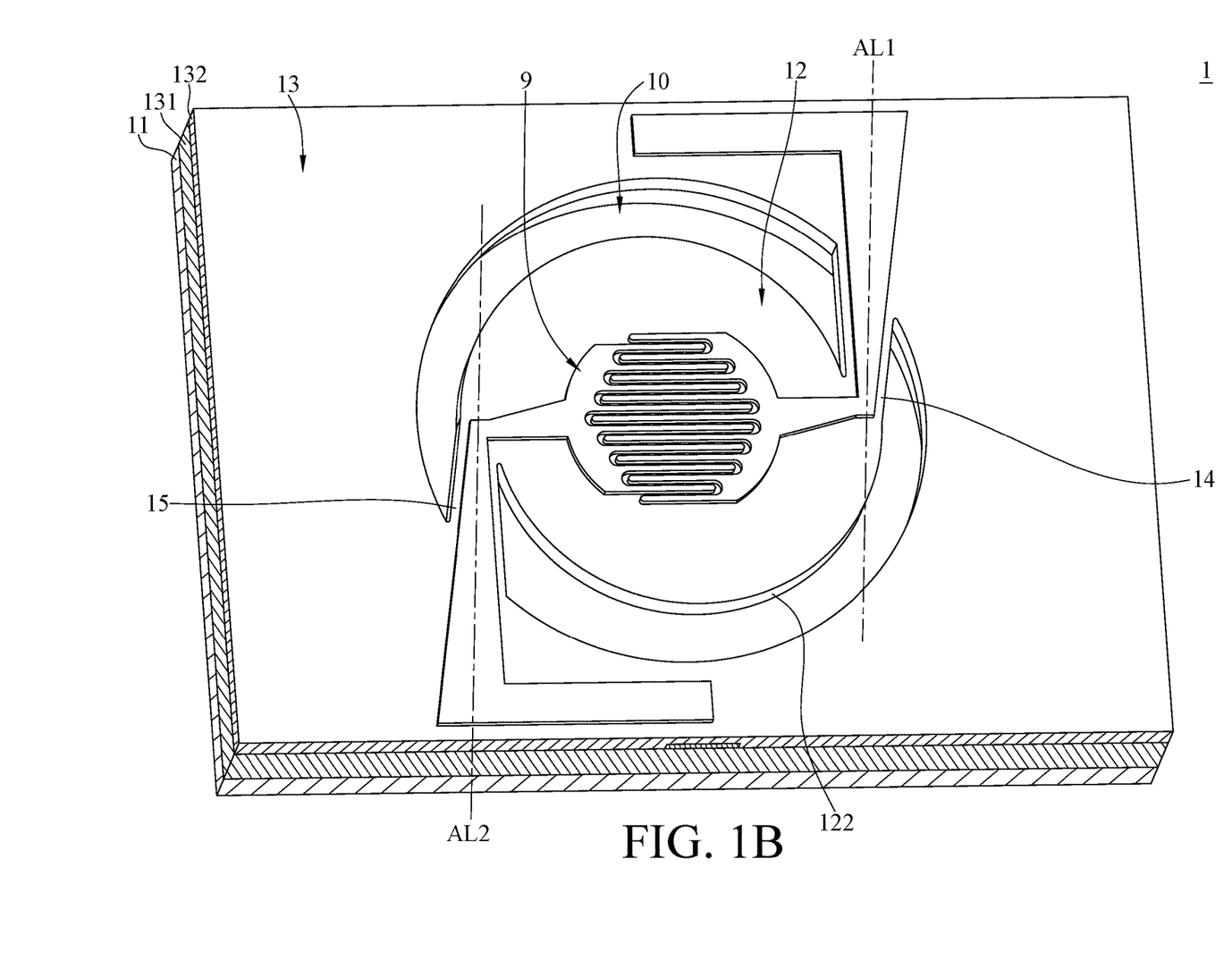
FIG. 1B is a three-dimensional view of the MEMS apparatus in FIG. 1A.

Please refer to FIG. 1A and FIG. 1B. FIG. 1A is a cross-sectional view of a MEMS apparatus according to one embodiment of the disclosure. FIG. 1B is a three-dimensional view of the MEMS apparatus in FIG. 1A.

In this embodiment, a MEMS apparatus 1 includes a substrate 11, a central part 12, a periphery part 13, a first connecting part 14, and a second connecting part 15.

The central part 12 includes a base 121 and a thin film layer 122. The base 121 of the central part 12 is suspended above the substrate 11, and the thin film layer 122 of the central part 12 is disposed on the base 121 of the central part 12. From top view, the thin film layer 122 of the central part 12 entirely covers the entire base 121 of the central part 12. A heater 123 is disposed in the thin film layer 122 of the central part 12. A sensor 9 is disposed on the thin film layer 122 of the central part 12.

The periphery part 13 includes a base 131 and a thin film layer 132. The base 131 of the periphery part 13 is disposed on the substrate 11, and a thickness of the base 131 of the periphery part 13 is greater than a thickness of the base 121 of the central part 12. In other embodiments, the base 121 of the central part 12 may be selectively removed.

The thin film layer 132 of the periphery part 13 is disposed on the base 131 of the periphery part 13. The periphery part 13 surrounds the central part 12, and a gap 10 is disposed between the periphery part 13 and the central part 12.

As shown in FIG. 1B, the first connecting part 14 extends along a reference line AL1, and the first connecting part 14 connects the thin film layer 122 of the central part 12 and the thin film layer 132 of the periphery part 13. The second connecting part 15 extends along a reference line AL2, and the second connecting part 15 connects the thin film layer 122 of the central part 12 and the thin film layer 132 of the periphery part 13. The thin film layer 122 of the central part 12, the thin film layer 132 of the periphery part 13, the first connecting part 14, and the second connecting part 15 may be formed by the same thin film structure.

Figure 1C:
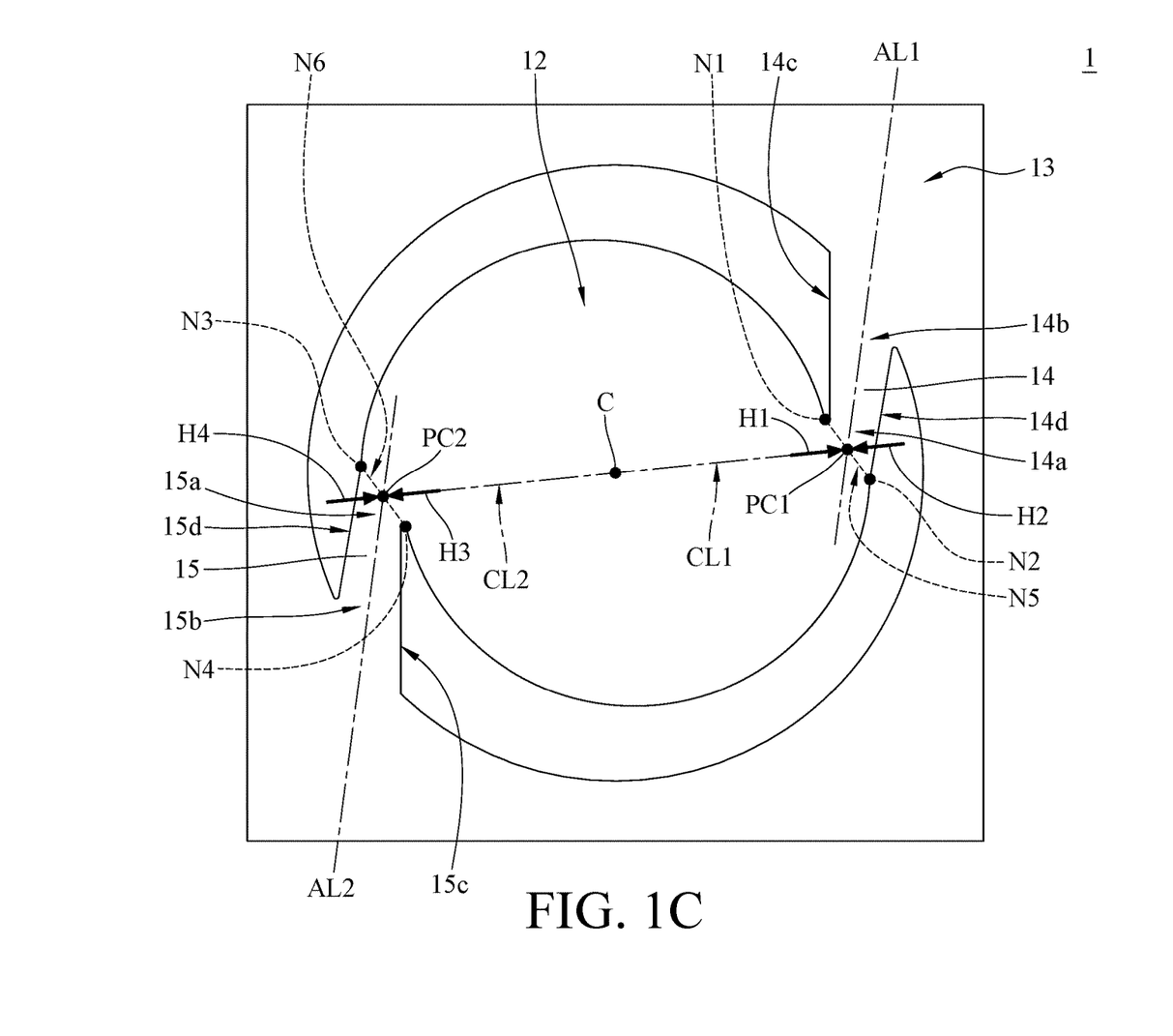
FIG. 1C is a simplified top view of the MEMS apparatus in FIG. 1A.

Please refer to FIG. 1C. FIG. 1C is a simplified top view of the MEMS apparatus in FIG. 1A. The central part 12 includes a center of mass C, a first joint PC1 and a second joint PC2. The first joint PC1 and the second joint PC2 are respectively located on a boundary of the central part 12. In detail, the first joint PC1 can be defined as a middle point of a line N5 connecting a first contact point N1 and a second contact point N2. The first contact point N1 is the contact point where an inner side 14c extends toward and contacts the central part 12. In other words, the first contact point N1 can be considered as the conjunction point between the inner side 14c and the central part 12. The second contact point N2 is the contact point where an outer side 14d extends toward and contacts the central part 12. In other words, the second contact point N2 can be considered as the conjunction point between the outer side 14d and the central part 12. Similarly, the second joint PC2 can be defined as a middle point of a line N6 connecting the third contact point N3 and the fourth contact point N4. The third contact point N3 is the contact point where an outer side 15d extends toward and contacts the central part 12, and the fourth contact point N4 is the contact point where an inner side 15c extends and contacts the central part 12. In other words, the third contact point N3 can be considered as the conjunction point between the outer side 15d and the central part 12, and the fourth contact point N4 can be considered as the conjunction point between the inner side 15c and the central part 12.

The first connecting part 14 includes a first inner connecting portion 14a and a first outer connecting portion 14b. The first inner connecting portion 14a is connected to the first joint PC1. The first outer connecting portion 14b is connected to the periphery part 13. The reference line AL1 passes through the first joint PC1. The reference line AL1 is not parallel to a first connecting line CL1 connecting the center of mass C and the first joint PC1.

When the central part 12 is heated and expanded, a radial displacement of the boundary of the central part 12 with respect to the center of mass is produced. Therefore, the first joint PC1 applies a force H1 to the first inner connecting portion 14a along the first connecting line CL1, and the first inner connecting portion 14a also applies a force H2 to the first joint PC1 along the first connecting line CL1. The first joint PC1 may be displaced along the first connecting line CL1 so that the first inner connecting portion 14a is displaced along the first connecting line CL1.

For a beam structure extending in an extension direction, when a force is applied on the beam structure so as to cause the beam structure to be deformed in a direction perpendicular to the extension direction, the beam structure is considered to experience a bent deformation. In this disclosure, the ratio of the force to the bent deformation in the direction perpendicular to the extension direction can be defined as an effective bending stiffness of the beam structure. On the other hand, for the same beam structure, when a force is applied on the beam structure so as to cause the beam structure to be compressed or extended in a direction parallel to the beam structure, the beam structure is considered to experience a compression or extension deformation. In this disclosure, the ratio of the force to the compression or extension deformation in the direction parallel to the extension direction can be defined as an effective axial stiffness of the beam structure.

For the beam structure, to obtain the same amount of the deformation both in the direction perpendicular to the extension direction and in the direction parallel to the extension direction, the force applied in the direction perpendicular to the extension direction is less than that applied in the direction parallel to the extension direction. In other words, a smaller amount of bending force is able to obtain the same amount of deformation compared to the compressing or extending force. That is, for a beam structure, the effective bending stiffness is less than the effective axial stiffness.

Since the reference line AL1 of the first connecting part 14 is not parallel to the first connecting line CL1 (i.e. the extending direction of the reference line AL1 is not parallel to the direction of the force H1), the first inner connecting portion 14a is deformed along a direction that is not parallel to the reference line AL1. When the central part 12 is heated and expanded, the first inner connecting portion 14a is deformed along the direction that is perpendicular to the reference line AL1, which induces that the first connecting part 14 to be bent.

Therefore, the first connecting part 14 can be connected to the central part 12 with effective bending stiffness that is less than the effective axial stiffness. Because the first connecting part 14 has less effective bending stiffness, the first connecting part 14 can be deformed more easily, thereby preventing the central part 12 from being warped due to the thermal stress.

In addition, in this embodiment, the first connecting part 14 may include the inner side 14c and the outer side 14d. The inner side 14c faces the central part 12 and the outer side 14d faces the periphery part 13. The length of the inner side 14c is greater than the length of the outer side 14d, but the disclosure is not limited thereto.

Similar to the first connecting part 14, the second connecting part 15 includes a second inner connecting portion 15a and a second outer connecting portion 15b. The second inner connecting portion 15a is connected to the second joint PC2 and the second outer connecting portion 15b is connected to the periphery part 13. The reference line AL2 passes through the second joint PC2. The reference line AL2 is not parallel to a second connecting line CL2 that connects the center of mass C and the second joint PC2.

Similarly, when the central part 12 is heated and expanded, a radial displacement of the boundary of the central part 12 with respect to the center of mass is produced. Therefore, the second joint PC2 applies a force H3 to the second inner connecting portion 15a along the second connecting line CL2 and the second inner connecting portion 15a also applies a force H4 to the second joint PC2 along the second connecting line CL2. The second joint PC2 may be displaced along the second connecting line CL2 so that the second inner connecting portion 15a is displaced along the second connecting line CL2.

Since the reference line AL2 of the second connecting part 15 is not parallel to the second connecting line CL2 (i.e. the extending direction of the reference line AL2 is not parallel to the direction of the force H3), the second inner connecting portion 15a is deformed along a direction that is not parallel to the reference line AL2. When the central part 12 is heated and expanded, the second inner connecting portion 15a is deformed along the direction that is perpendicular to the reference line AL1, which induces that the second connecting part 15 is to be bent.

Therefore, the second connecting part 15 can be connected to the central part 12 with effective bending stiffness that is less than the effective axial stiffness. Because the second connecting part 15 has lower effective bending stiffness, the second connecting part 15 can be deformed more easily, thereby preventing the central part 12 from being warped due to the thermal stress.

The second connecting part 15 may include an inner side 15*c* and an outer side 15*d*. The inner side 15*c* faces the central part 12 and the outer side 15*d* faces the periphery part 13. The length of the inner side 15*c* is greater than the length of the outer side 15*d*.

In this embodiment, a line connecting the first joint PC1 and the second joint PC2 passes through the center of mass C, and the first connecting line CL1 and the second connecting line CL2 can be aligned, but the disclosure is not limited thereto. In other embodiments, the line connecting the first joint PC1 and the second joint PC2 may not pass through the center of mass C In this embodiment, the first joint PC1 and the second joint PC2 may be point symmetry with respect to the center of mass C, but the disclosure is not limited thereto. In other embodiments, the first joint PC1 and the second joint PC2 may not be point symmetry.

When the heater 123 (as shown in FIG. 1A) is in operation, the first joint PC1 of the central part 12 is displaced along the direction of the force H1, and the second joint PC2 is displaced along the direction of the force H3. As the first joint PC1 and the second joint PC2 are displaced, the thermal stress in the heated central part 12 can be released because the first connecting part 14 and the second connecting part 15 are able to be bent easily. Therefore, the deformation of the central part 12 is smaller or the warpage of the central part 12 is reduced. Therefore, the deformation and the warpage of the sensor 9 (as shown in FIG. 1A) disposed on the central part 12 can also be reduced, thereby improving the reliability of the sensor 9 and the measuring accuracy of the sensor 9.

In the embodiments shown in FIG. 1A, FIG. 1B and FIG. 1C, the reference line AL1 is neither parallel to nor perpendicular to the first connecting line CL1 and the reference line AL2 is neither parallel to nor perpendicular to the second connecting line CL2. The reference line AL1 and the reference line AL2 are not the tangent line of the boundary of the central part 12, but the disclosure is not limited thereto. In other embodiments, the reference line AL1 and the reference line AL2 may be respectively perpendicular to the first and second connecting lines CL1 and CL2 or may be tangent lines of the boundary of the central part.

Figure 1D:
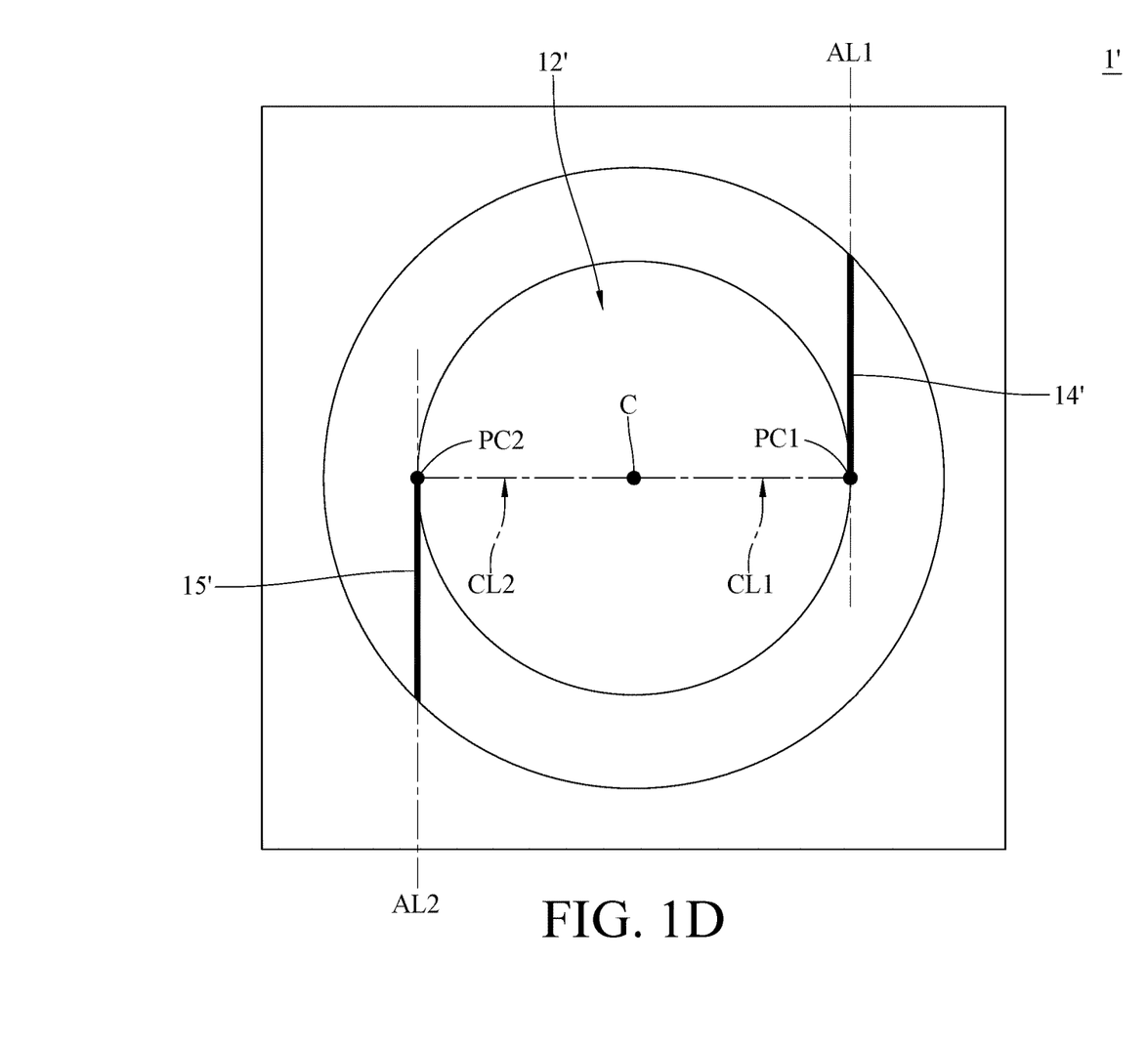
FIG. 1D is a simplified top view of a MEMS apparatus according to another embodiment of the disclosure.

For example, please refer to FIG. 1D. FIG. 1D is a simplified top view of a MEMS apparatus according to another embodiment of the disclosure. In this embodiment, for the purpose of illustration, a first connecting part 14' and a second connecting part 15' are drawn in thick lines, but shapes and dimensions of the first connecting part 14' and the second connecting part 15' are not limited thereto. A MEMS apparatus 1' in the present embodiment and the MEMS apparatus 1 in FIG. 1C may have the following differences.

In this embodiment, from the top view, the shape of a central part 12' is circular, but the disclosure is not limited thereto.

In this embodiment, the reference line AL1 of the first connecting part 14' is perpendicular to the first connecting line CL1 that connects the center of mass C and the first joint PC1. The reference line AL1 of the first connecting part 14' is a tangent line passing through the first joint PC1 that is located on the boundary of the central part 12', but the disclosure is not limited thereto. Since the reference line AL1 is the tangent line passing through the first joint PC1, more bending deformation of the first connecting part 14' (along the radial direction) is generated while the central part 12' is heated, thereby further reducing the effective bending stiffness of the first connecting part 14'. Therefore, the central part 12' is prevented from being warped due to the thermal stress.

In this embodiment, the reference line AL2 of the second connecting part 15' is perpendicular to the second connecting line CL2 that connects the center of mass C and the second joint PC2. The reference line AL2 of the second connecting part 15' may be a tangent line passing through the second joint PC2 located on the boundary of the central part 12', but the disclosure is no limited thereto. Since the reference line AL2 is the tangent line passing through the second joint PC2, more bending deformation of the second connecting part 15' (along the radial direction) is generated while the central part 12' is heated, thereby further reducing the effective bending stiffness of the second connecting part 15'. Therefore, the central part 12' is prevented from being warped due to the thermal stress.

Figure 2A:
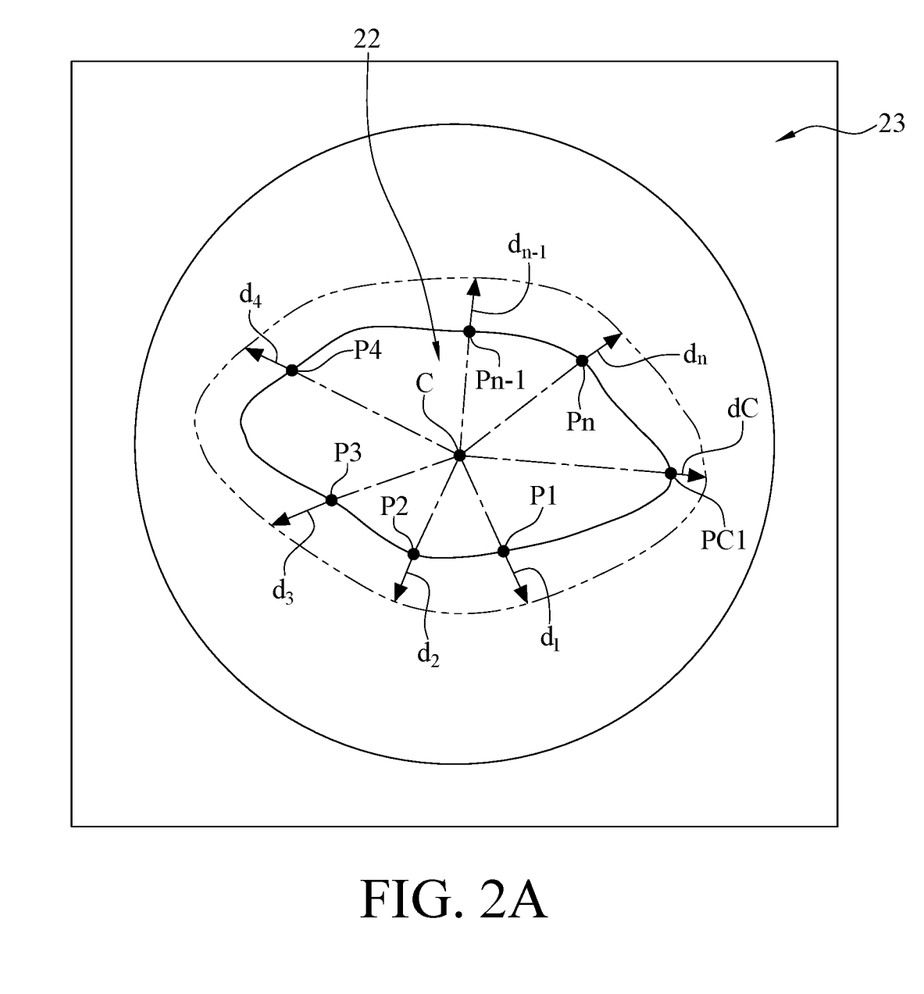
FIG. 2A is a top view of a central part and a periphery part of a MEMS apparatus according to another embodiment of the disclosure.
Figure 2B:
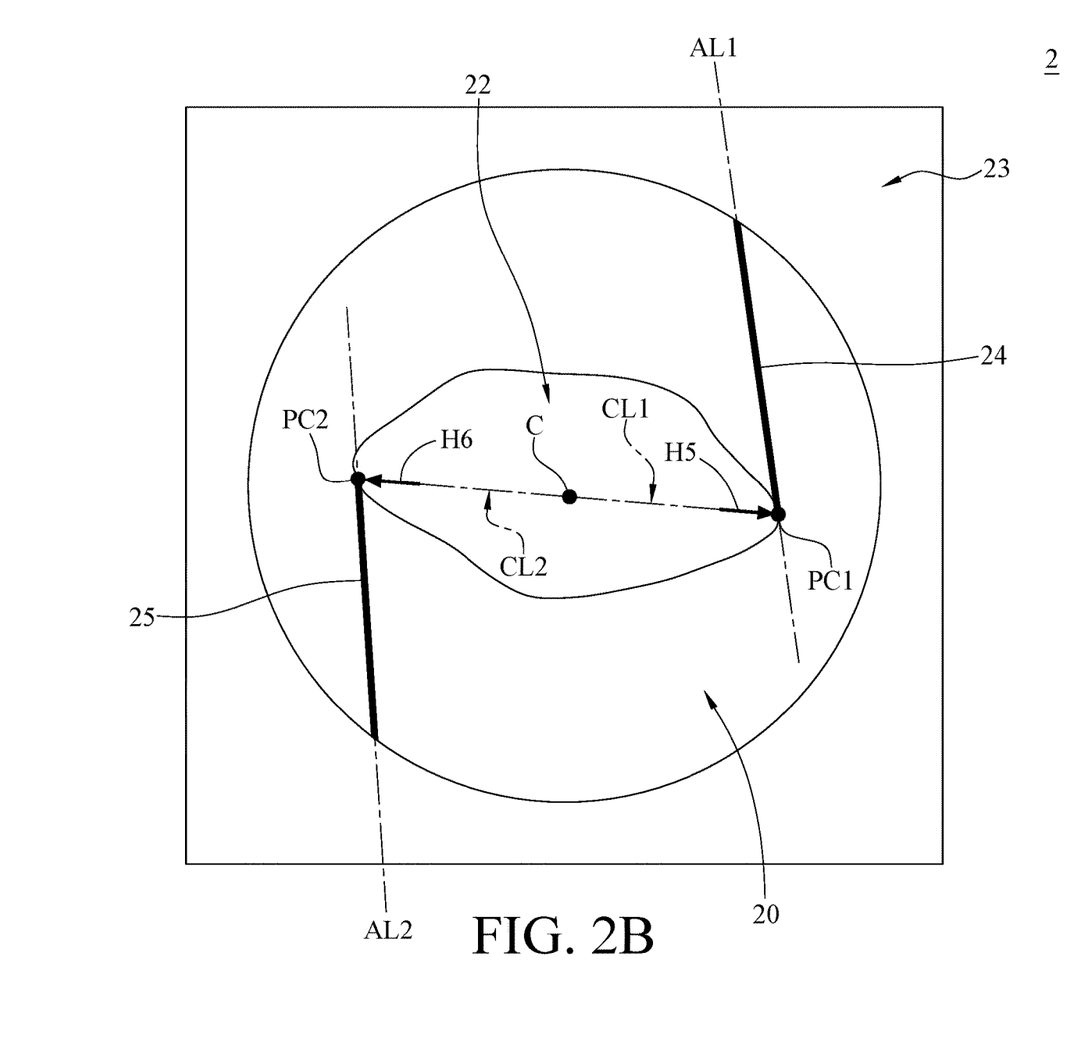
FIG. 2B is a top view of the MEMS apparatus in FIG. 2A.

Please refer to FIG. 2A and FIG. 2B. FIG. 2A is a top view of a central part and a periphery part of a MEMS apparatus according to another embodiment of the disclosure. FIG. 2B is a top view of the MEMS apparatus in FIG. 2A.

In this embodiment, a MEMS apparatus 2 includes a central part 22, a periphery part 23, a first connecting part 24 and a second connecting part 25. The periphery part 23 surrounds the central part 22 and there is a gap 20 between the periphery part 23 and the central part 22. The central part 22 includes a center of mass C, a first joint PC1 and a second joint PC2. The first joint PC1 and the second joint PC2 are located on a boundary of the central part 22. In addition, from the top view, the shape of the central part 22 is irregular, but the disclosure is not limited thereto. In other embodiments, the central part 22 may be in other shapes from the top view.

FIG. 2A shows the displacement of the first joint PC1 and the displacements of the points P1, P2, P3, P4, Pn-1 after the central part 22 is heated. In FIG. 2A, the central part 22 represented by thick line is not heated yet and the central part 22 represented by dashed-line is heated. The dC, $d_1$, $d_2$, $d_3$, $d_4$, $d_{n-1}$, and $d_n$ are the displacements of the first joint PC1 and points P1, P2, P3, P4, Pn-1, and Pn respectively during the heating. The displacement dC is the minimum displacement compared to the displacements $d_1$, $d_2$, $d_3$, $d_4$, $d_{n-1}$, and $d_n$. Thus, the first connecting part 24 may apply the minimum force to the first joint PC1 so that the first connecting part 24 has minimum deformation and the thermal stress in the central part 22 can be released to prevent the central part 22 from being warped.

The first connecting part 24 extends along the reference line AL1 and connects the first joint PC1 and the periphery part 23. The reference line AL1 passes through the first joint PC1. The reference line AL1 is not parallel to the first connecting line CL1 that connects the center of mass C and the first joint PC1. By this way, the first connecting part 24 that has lower effective bending stiffness is connected to the central part 22 such that the first connecting part 24 is deformed more easily when the central part 22 is heated. Thus, the central part 22 can be prevented from being warped due to the thermal stress.

An extension line of the first connecting line CL1 may intersect the boundary of the central part 22 at the second joint PC2, and the line connecting the first joint PC1 and the second joint PC2 passes through the center of mass C. That is, the first connecting line CL1 and the second connecting line CL2 are aligned.

The second connecting part 25 extends along the reference line AL2 and connects the second joint PC2 located on the boundary of the central part 22 and the periphery part 23. The reference line AL2 passes through the second joint PC2. The reference line AL2 is not parallel to the second connecting line CL2 that connects the center of mass C and the second joint PC2. By this way, the second connecting part 25 that has lower effective bending stiffness is connected to the central part 22, such that the second connecting part 25 is deformed more easily when the central part 22 is heated. Thus, the central part 22 can be prevented from being warped due to the thermal stress.

In this embodiment, the reference line AL1 may be a tangent line passing through the first joint PC1 located on the boundary of the central part 22, but the disclosure is not limited thereto. Since the reference line AL1 is the tangent line passing through the first joint PC1, larger bending deformation (along the radial direction) of the first connecting part 24 is generated while the central part 22 is heated, thereby inducing smaller effective bending stiffness of the first connecting part 24. The central part 22 is then prevented from being warped due to the thermal stress. In other embodiments, the reference line AL1 may also not be the tangent line of the boundary of the central part 22.

In this embodiment, the reference line AL2 may not be the tangent line passing through the second joint PC2 of the boundary of the central part 22, but the disclosure is not limited thereto. In other embodiments, the reference line AL2 may also be the tangent line passing through the second joint PC2 located on the boundary of the central part 22.

As shown in FIG. 2B, when the central part 22 is heated, the first joint PC1 is displaced along a direction of a force H5, and the second joint PC2 is displaced along a direction of a force H6. Since the first connecting part 24 and the second connecting part 25 are easily to be bent, the thermal stress in the heated central part 22 can be released. Accordingly, the warpage of the central part 22 is reduced. Hence, the reliability and measuring accuracy of the sensor disposed on the central part 22 is improved.

Figure 3:
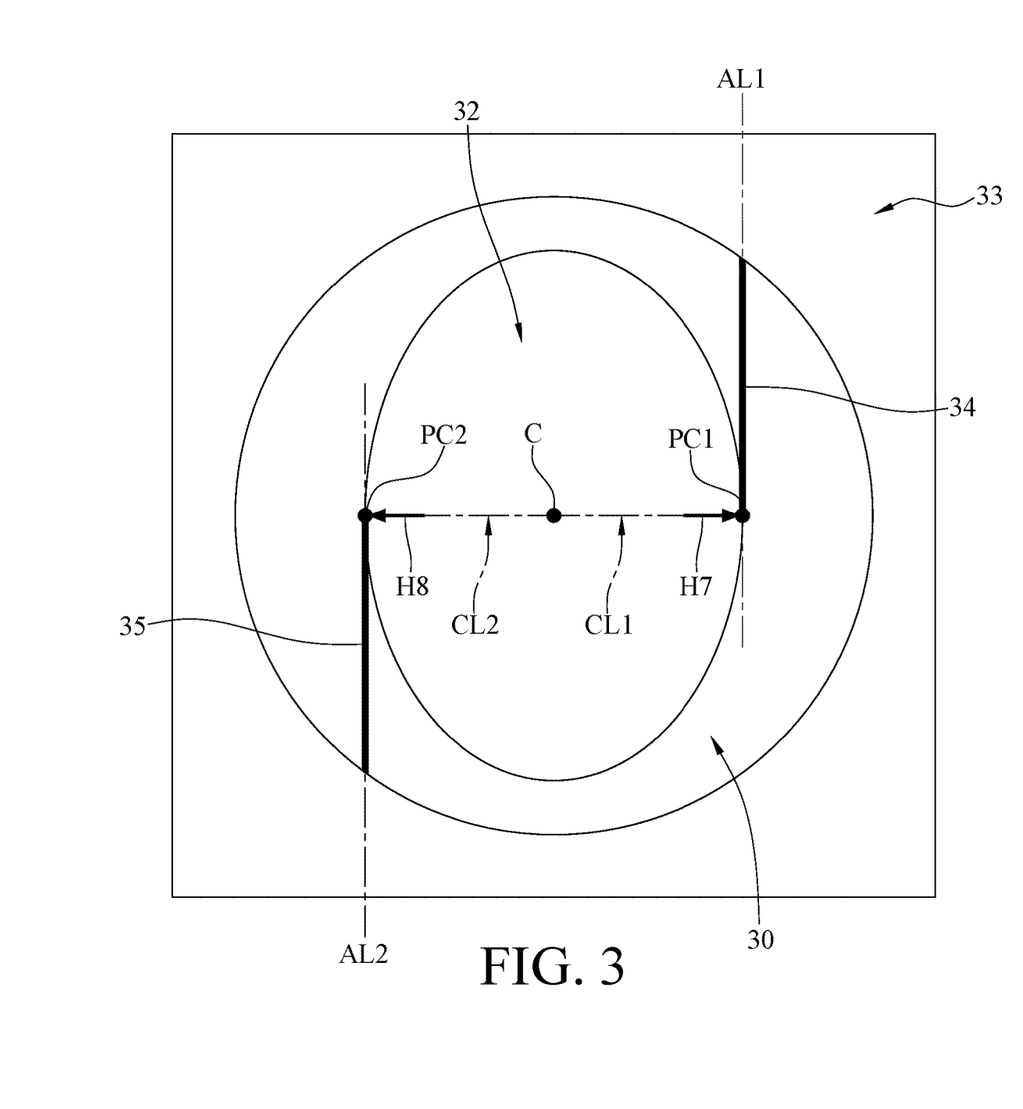
FIG. 3 is a top view of a MEMS apparatus according to yet still another embodiment of the disclosure.

Please refer to FIG. 3. FIG. 3 is a top view of a MEMS apparatus according to yet still another embodiment of the disclosure.

In this embodiment, a MEMS apparatus 3 includes a central part 32, a periphery part 33, a first connecting part 34 and a second connecting part 35. The periphery part 33 surrounds the central part 32 and there is a gap 30 between the periphery part 33 and the central part 32. The central part 32 includes a center of mass C, a first joint PC1 and a second joint PC2. The first joint PC1 and the second joint PC2 are located on the boundary of the central part 32. In this embodiment, the shape of the central part 32 is ellipse, but the disclosure is not limited thereto. In other embodiments, the central part 32 may be in other point-symmetric shapes with respect to the center of mass C, such as rectangles or equilateral polygons with even sides. The equilateral polygons with even sides are, for example, squares or equilateral hexagons and so on.

In this embodiment, the first joint PC1 and the second joint PC2 are located on two ends of the semi-minor axis of the ellipse. When the central part 32 is heated, the displacement of the first joint PC1 along radial direction (the extension direction of the first connecting line CL1) and the displacement of the second joint PC2 along radial direction (the extension direction of the second connecting line CL2) are minimum displacements. Thus, the thermal stress in the central part 32 can be released to prevent the central part 32 from being warped.

The first connecting part 34 extends along the reference line AL1 and connects the first joint PC1 and the periphery part 33. The reference line AL1 passes through the first joint PC1. The reference line AL1 is not parallel to the first connecting line CL1 that connects the center of mass C and the first joint PC1. By this way, the first connecting part 34 that has lower effective bending stiffness is connected to the central part 32. Since the first connecting part 34 can be bent more easily, the warpage of the central part 32 is prevented.

The second connecting part 35 extends along the reference line AL2 and connects the second joint PC2 and the periphery part 33. The reference line AL2 passes through the second joint PC2. The reference line AL2 is not parallel to the second connecting line CL2 that connects the center of mass C and the second joint PC2. By this way, the second connecting part 35 that has lower effective bending stiffness is connected to the central part 32. Thus, the central part 32 can be bent more easily and prevented from being warped.

In this embodiment, the line that connects the first joint PC1 and the second joint PC2 passes through the center of mass C. The first connecting line CL1 and the second connecting line CL2 are aligned with the line that connects the first joint PC1 and the second joint PC2, but the disclosure is not limited thereto. In other embodiments, the line that connects the first joint and the second joint may not pass through the center of mass C.

In this embodiment, the first joint PC1 and the second joint PC2 may be point symmetric with respect to the center of mass C, but the disclosure is not limited thereto. In other embodiments, the first joint PC1 and the second joint PC2 may not be point symmetric.

In this embodiment, the reference line AL1 is perpendicular to the first connecting line CL1 and the reference line AL1 is a tangent line passing through the first joint PC1 located on the boundary of the central part 32, but the present disclosure is not limited thereto. Since the reference line AL1 is the tangent line passing through the first joint PC1, the first connecting part 34 can generate more bending deformation along the radial direction while the central part 32 is heated. It further reduces the effective bending stiffness of the first connecting part 34. Since the effective bending stiffness of the first connecting part 34 is reduced, the central part 32 can be prevented from being warped. In other embodiments, the reference line AL1 may not be the tangent line passing through the boundary of the central part 32.

In this embodiment, the reference line AL2 is perpendicular to the second connecting line CL2, and the reference line AL2 is a tangent line passing through the second joint PC2 located on the boundary of the central part 32, but the disclosure is not limited thereto. Since the reference line AL2 is the tangent line passing through the first joint PC2, the second connecting part 35 can generate more bending deformation along the radial direction while the central part 32 is heated. It further reduces the effective bending stiffness of the second connecting part 35. Since the effective bending stiffness of the second connecting part 35 is reduced, the central part 32 can be prevented from being warped. In other embodiments, the reference line AL2 may not be the tangent line of the boundary of the central part 32.

Figure 4:
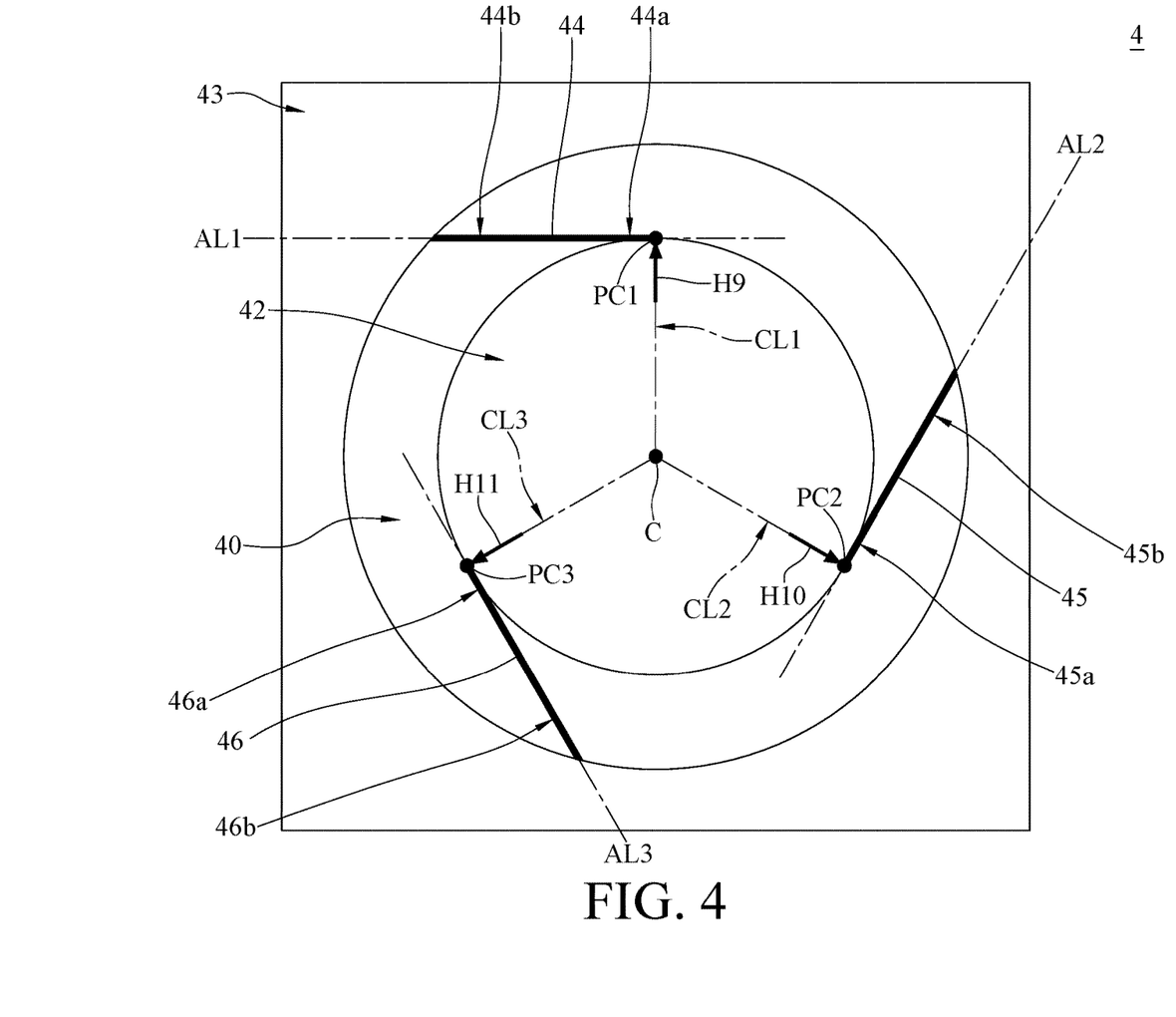
FIG. 4 is a top view of a MEMS apparatus according to further another embodiment of the disclosure.

When the central part 32 is heated, the first joint PC1 is displaced along a direction of a force H7 and the second joint PC2 is displaced along a direction of a force H8. When the first joint PC1 and the second joint PC2 are displaced, the thermal stress in the heated central part 32 can be released because the first connecting part 34 and the second connecting part 35 can be bent easily. It prevents the central part 32 from being warped. Accordingly, the reliability and the measuring accuracy of the sensor disposed on the central part 32 can be improved. Please refer to FIG. 4. FIG. 4 is a top view of a MEMS apparatus according to further another embodiment of the disclosure.

In this embodiment, a MEMS apparatus 4 includes a central part 42, a periphery part 43, a first connecting part 44, a second connecting part 45 and a third connecting part 46. The periphery part 43 surrounds the central part 42 and there is a gap 40 disposed between the periphery part 43 and the central part 42. The central part 42 includes a center of mass C, a first joint PC1, a second joint PC2 and a third joint PC3. The first joint PC1, the second joint PC2 and the third joint PC3 are located on a boundary of the central part 42 respectively.

In this embodiment, a shape of the top view of the central part 42 is circular, but the disclosure is not limited thereto. In other embodiments, the central part 42 may be in other point symmetric shapes with respect to the center of the mass, such as equilateral polygons whose amount of the sides is a multiple of three. Such polygons are, for example, equilateral triangles or equilateral hexagons.

In this embodiment, the first joint PC1, the second joint PC2 and the third joint PC3 are point symmetric with respect to the center of mass C, but the disclosure is not limited thereto. In other embodiments, the first joint PC1, the second joint PC2 and the third joint PC3 may not be point symmetric with respect to the center of mass C.

In this embodiment, the first connecting line CL1 connecting the center of mass C and the first joint PC1, the second connecting line CL2 connecting the center of mass C and the second joint PC2 and a third connecting line CL3 connecting the center of mass C and the third joint PC3 divide the central part 42 into three equal parts roughly.

The first connecting part 44 extends along the reference line AL1 and connects the central part 42 and the periphery part 43. The first connecting part 44 includes a first inner connecting portion 44a and a first outer connecting portion 44b. The first inner connecting portion 44a is connected to the first joint PC1. The first outer connecting portion 44b is connected to the periphery part 43. The reference line AL1 passes through the first joint PC1. The reference line AL1 is not parallel to the first connecting line CL1 that connects the center of mass C and the first joint PC1. By this way, the first connecting part 44 that has lower effective bending stiffness is connected to the central part 42. Accordingly, the first connecting part 44 is bent more easily to prevent the central part 42 from being warped.

In this embodiment, the reference line AL1 of the first connecting part 44 is perpendicular to the first connecting line CL1. The reference line AL1 of the first connecting part 44 is a tangent line passing through the first joint PC1 located on the boundary of the central part 42, but the disclosure is not limited thereto. Since the reference line AL1 is the tangent line passing through the first joint PC1, the first connecting part 44 (along radial direction) can generate more bending deformation while the central part 42 is heated. It decreases the effective bending stiffness of the first connecting part 44. Since the effective bending stiffness of the first connecting part 44 is reduced, it prevents the central part 42 from being warped.

The second connecting part 45 extends along the reference line AL2 and connects the central part 42 and the periphery part 43. The second connecting part 45 includes a second inner connecting portion 45a and a second outer connecting portion 45b. The second inner connecting portion 45a is connected to the second joint PC2. The second outer connecting portion 45b is connected to the periphery part 43. The reference line AL2 passes through the second joint PC2. The reference line AL2 is not parallel to the second connecting line CL2 that connects the center of mass C and the second joint PC2. By this way, the second connecting part 45 is connected to the central part 42 with lower effective bending stiffness. Accordingly, the second connecting part 45 can be bent more easily to prevent the central part 42 from being warped.

In this embodiment, the reference line AL2 of the second connecting part 45 is perpendicular to the second connecting line CL2. The reference line AL2 of the second connecting part 45 is a tangent line passing through the second joint PC2 on the boundary of the central part 42, but the disclosure is not limited thereto. Because the reference line AL2 is the tangent line passing through the second joint PC2, the second connecting part 45 (along radial direction) can generate more bending deformation when the central part 42 is heated. It reduces the effective bending stiffness of the second connecting part 45. Since the second connecting part 45 has lower effective bending stiffness, the central part 42 is prevented from being warped.

The third connecting part 46 extends along the reference line AL3 and connects the central part 42 and the periphery part 43. The third connecting part 46 includes a third inner connecting portion 46a and a third outer connecting portion 46b. The third inner connecting portion 46a is connected to the third joint PC3. The third outer connecting portion 46b is connected to the periphery part 43. The reference line AL3 passes through the third joint PC3. The reference line AL3 is not parallel to the third connecting line CL3 that connects the center of mass C and the third joint PC3. By this way, the third connecting part 46 that has lower effective bending stiffness is connected to the central part 42. Since the third connecting part 46 is bent more easily, the warpage of the central part 42 is prevented.

In this embodiment, the reference line AL3 of the third connecting part 46 is perpendicular to the third connecting line CL3. The reference line AL3 of the third connecting part 46 is a tangent line passing through the third joint PC3 that is located on the boundary of the central part 42, but the disclosure is not limited thereto. Because the reference line AL3 is the tangent line passing through the third joint PC3, the third connecting part 46 (along radial direction) would generate more bending deformation while the central part 42 is heated. Accordingly, it reduces the effective bending stiffness of the third connecting part 46 to prevent the central part 42 from being warped.

When the central part 42 is heated, the first joint PC1 is displaced along a force H9, the second joint PC2 is displaced along a force H10, and the third joint PC3 is displaced along a force H11. When the first joint PC1, the second joint PC2 and the third joint PC3 are displaced, the first connecting part 44, the second connecting part 45 and the third connecting part 46 can be bent easily. It makes the thermal stress in the heated central part 42 to be released to prevent the central part 42 from being warped. Since the deformation or warpage of the central part 42 is prevented, the deformation or warpage of the sensor is then reduced to improve the reliability and the measuring accuracy of the sensor.

Figure 5:
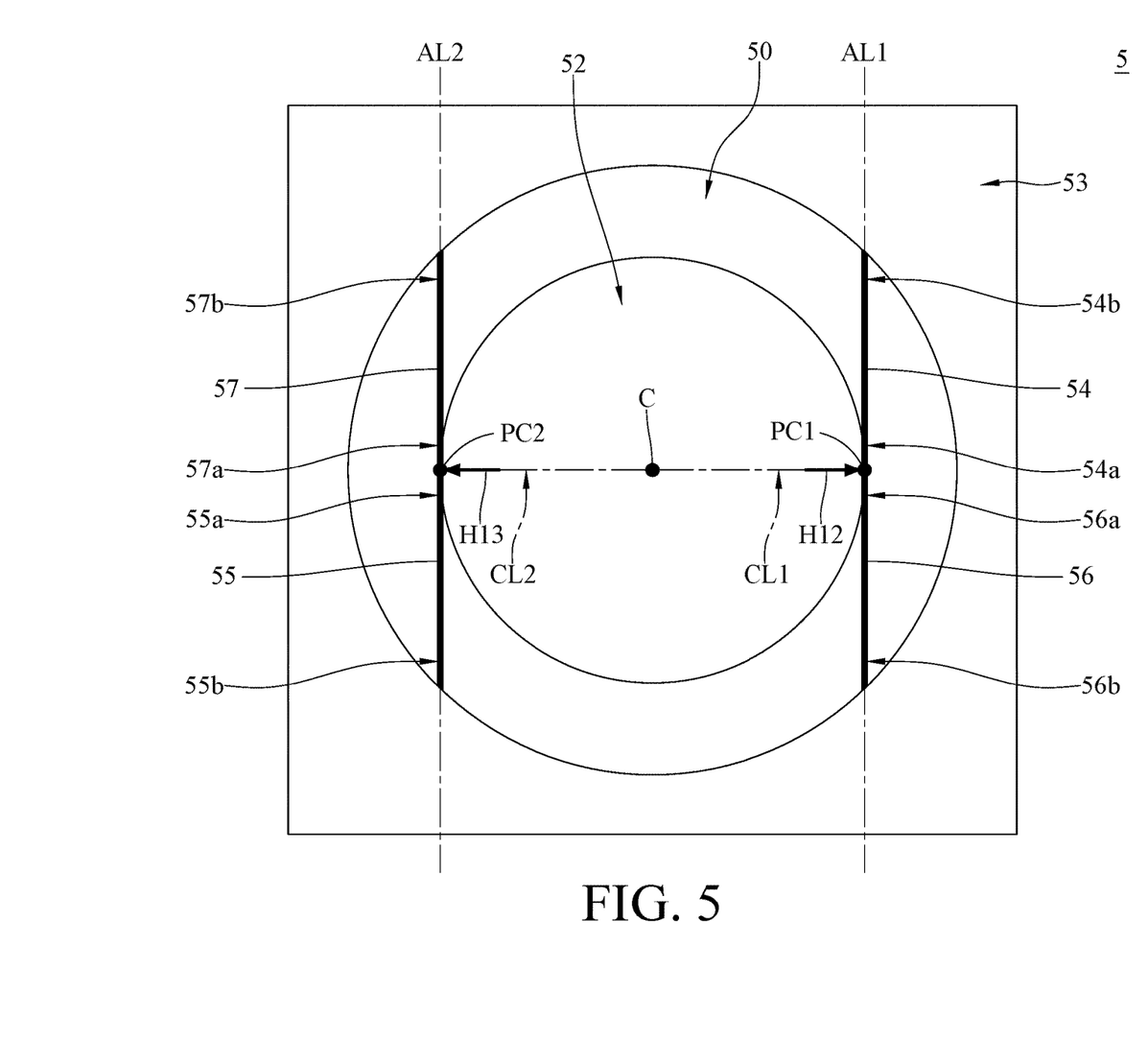
FIG. 5 is a top view of a MEMS apparatus according to further another embodiment of the disclosure.

Please refer to FIG. 5. FIG. 5 is a top view of a MEMS apparatus according to further another embodiment of the disclosure.

In this embodiment, a MEMS apparatus 5 includes a central part 52, a periphery part 53, a first connecting part 54, a second connecting part 55, a third connecting part 56 and a fourth connecting part 57. The periphery part 53 surrounds the central part 52 and there is a gap 50 between the periphery part 53 and the central part 52. The central part 52 includes a center of mass C, a first joint PC1 and a second joint PC2. The first joint PC1 and the second joint PC2 are located on the boundary of the central part 52.

In this embodiment, the shape of the central part 52 is circular, but the disclosure is not limited thereto. In other embodiments, the central part 52 may be in other point symmetric shapes, such as rectangles, squares, equilateral hexagons or other equilateral polygons with even sides.

In this embodiment, the first connecting line CL1 and second connecting line CL2 extend along the line that passes through the center of mass C and connects the first joint PC1 and the second joint PC2, but the disclosure is not limited thereto. In other embodiments, the line passing through the first joint PC1 and the second joint PC2 may not pass through the center of mass C.

In this embodiment, the first joint PC1 and the second joint PC2 are point symmetric with respect to the center of mass C, but the disclosure is not limited thereto. In other embodiments, the first joint PC1 and the second joint PC2 may not be point symmetric with respect to the center of mass C.

The first connecting part 54 and the third connecting part 56 both extend along the reference line AL1 and connect the central part 52 and the periphery part 53 respectively. The first connecting part 54 includes a first inner connecting portion 54a and a first outer connecting portion 54b. The first inner connecting portion 54a is connected to the first joint PC1. The first outer connecting portion 54b is connected to the periphery part 53. The third connecting part 56 includes a third inner connecting portion 56a and a third outer connecting portion 56b. The third inner connecting portion 56a is connected to the first joint PC1. The third outer connecting portion 56b is connected to the periphery part 53. The reference line AL1 passes through the first joint PC1. The reference line AL1 is not parallel to the first connecting line CL1 that connects the center of mass C and the first joint PC1. By this way, the first connecting part 54 and the third connecting part 56 are connected to the central part 52 and can generate more bending deformation to reduce the effective bending stiffness to prevent the central part 52 from being warped.

In this embodiment, the reference line AL1 of the first connecting part 54 and the third connecting part 56 is perpendicular to the first connecting line CL1. The reference line AL1 is a tangent line passing through the first joint PC1 located on the boundary of the central part 52, but the disclosure is not limited thereto. Because the reference line AL1 is the tangent line passing through the first joint PC1, the first connecting part 54 and the third connecting part 56 (along the radial direction) would generate more bending deformation while the central part 52 is heated. Since the first connecting part 54 and the third connecting part 56 have lower effective bending stiffness, the warpage of central part 52 is prevented.

The second connecting part 55 and the fourth connecting part 57 both extend along the reference line AL2 and connect the central part 52 and the periphery part 53 respectively. The second connecting part 55 includes a second inner connecting portion 55a and a second outer connecting portion 55b. The second inner connecting portion 55a is connected to the second joint PC2. The second outer connecting portion 55b is connected to the periphery part 53. The fourth connecting part 57 includes a fourth inner connecting part 57a and a fourth outer connecting part 57b. The fourth inner connecting part 57a is connected to the second joint PC2. The fourth outer connecting part 57b is connected to the periphery part 53. The reference line AL2 passes through the second joint PC2. The reference line AL2 is not parallel to the second connecting line CL2 that connects the center of mass C and the second joint PC2. By this way, the second connecting part 55 and the fourth connecting part 57 that can generate more bending deformation are connected to the central part 52. Since the second connecting part 55 and the fourth connecting part 57 have lower effective bending stiffness, the second connecting part 55 and the fourth connecting part 57 can be bent more easily to prevent the central part 52 from being warped due to the thermal stress.

In this embodiment, the reference line AL2 of the second connecting part 55 and the fourth connecting part 57 is perpendicular to the second connecting line CL2. The reference line AL2 is a tangent line passing through the second joint PC2 located on the boundary of the central part 52, but the disclosure is not limited thereto. Because the reference line AL2 is the tangent line passing through the second joint PC2, more bending deformations of the second connecting part 55 and the fourth connecting part 57 (along the radial direction) are generated while the central part 52 is heated. Accordingly, it reduces the effective bending stiffness of the second connecting part 55 and the fourth connecting part 57 to prevent the central part 52 from being warped.

When the central part 52 is heated, the first joint PC1 is displaced along a direction of a force H12 and the second joint PC2 is displaced along a direction of a force H13 to release the thermal stress in the heated central part 52. Because the first connecting part 54, the second connecting part 55, the third connecting part 56 and the fourth connecting part 57 can be bent easily, the central part 52 is prevented from being deformed or warped. Since the sensor disposed on the central part 52, the sensor is also prevented from being deformed or warped, thereby improving the reliability and measuring accuracy of the sensor.

According to the MEMS apparatus discussed above, since the reference line of the first connecting part is not parallel to the first connecting line that connects the center of mass and the first joint, the first connecting part can be connected to the central part with a lower effective bending stiffness. Also, since the reference line of the second connecting part is not parallel to the second connecting line that connects the center of mass and the second joint, the second connecting part can be connected to the central part with a lower effective bending stiffness. While the heater heats the central part to cause the first joint and the second joint to be displaced, the first connecting part and the second connecting part can be deformed more easily due to the lower effective bending stiffness. Therefore, the central part is prevented from being deformed or warped due to the thermal stress. Accordingly, it ensures the reliability and the measuring accuracy of the MEMS apparatus.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A MEMS apparatus with heater, comprising:
a central part, comprising:
a center of mass;
a heater, disposed in the central part; and
a first joint, located on a boundary of the central part, wherein a displacement of the first joint is produced when the central part is heated by the heater;
a periphery part, surrounding the central part;

a gap, wherein the gap surrounds the central part, and is located between the central part and the periphery part; and a first connecting part, connecting the central part and the periphery part along a first reference line and comprising:
    a first inner connecting portion, connected to the first joint; and
    a first outer connecting portion, connected to the periphery part;
    wherein, the first reference line passes through the first joint, and the first reference line is not parallel to a first connecting line that connects the center of mass and the first joint.

2. The MEMS apparatus with heater as claimed in claim 1, wherein the first reference line is a tangent line passing through the first joint, and an angle between the first reference line and the first connecting line is larger than or equal to 90 degrees.

3. The MEMS apparatus with heater as claimed in claim 2, wherein the first connecting part comprises an inner side and an outer side, and a length of the inner side is greater than a length of the outer side.

4. The MEMS apparatus with heater as claimed in claim 3, further comprising:
    a second connecting part, connecting the central part and the periphery part;
    wherein the central part further comprises a second joint located on the boundary of the central part, and a line connecting the first joint and the second joint passes through the center of mass.

5. The MEMS apparatus with heater as claimed in claim 1, wherein the first joint is disposed at a position on a boundary of the central part, wherein the position has a minimum displacement when the central part is not connected with the first connecting part and the central part is heated.

6. The MEMS apparatus with heater as claimed in claim 1, further comprising:
    a second connecting part and a third connecting part;
    wherein the central part further comprises a second joint located on the boundary of the central part and a third joint located on the boundary of the central part, the second connecting part connects the central part and the periphery part along a second reference line, the second connecting part comprises a second inner connecting portion and a second outer connecting portion, the second inner connecting portion is connected to the second joint, the second outer connecting portion is connected to the periphery part, the third connecting part connects the central part and the periphery part along a third reference line, the third connecting part comprises a third inner connecting portion and a third outer connecting portion, the third inner connecting portion is connected to the third joint, the third outer connecting portion is connected to the periphery part, and the first connecting line, a second connecting line connecting the second joint and the center of mass, and a third connecting line connecting the third joint and the center of mass are not aligned.

7. The MEMS apparatus with heater as claimed in claim 1, further comprising:
    a second connecting part, a third connecting part and a fourth connecting part;
    wherein the central part further comprises a second joint located on the boundary, the third connecting part connects the central part and the periphery part along the first reference line, the third connecting part comprises a third inner connecting portion and a third outer connecting portion, the third inner connecting portion is connected to the first joint, the third outer connecting portion is connected to the periphery part, the second connecting part connects the central part and the periphery part along a second reference line and the fourth connecting part connects the central part and the periphery part along the second reference line, the second connecting part comprises a second inner connecting portion and a second outer connecting portion, the second inner connecting portion is connected to the second joint, the second outer connecting portion is connected to the periphery part, the fourth connecting part comprises a fourth inner connecting part and a fourth outer connecting part, the fourth inner connecting part is connected to the second joint, and the fourth outer connecting part is connected to the periphery part.

8. A MEMS apparatus with heater, comprising:
    a substrate;
    a central part, comprising:
    a center of mass; a first thin film layer, disposed on the substrate;
    a heater, disposed in the first thin film layer; and
    a first joint, located on a boundary of the central part, wherein a displacement of the first joint is produced when the central part is heated by the heater;
    a periphery part, surrounding the central part, the periphery part comprising:
    a base, disposed on the substrate; and
    a second thin film layer, disposed on the base;
    a gap, wherein the gap surrounds the central part, and is located between the central part and the periphery part; and
    a first connecting part, connecting the first thin film layer and the second thin film layer along a first reference line, the first connecting part comprising:
        a first inner connecting portion, connected to the first joint; and
        a first outer connecting portion, connected to the periphery part;
        wherein, the first reference line passes through the first joint, and the first reference line is not parallel to a first connecting line that connects the center of mass and the first joint.

9. The MEMS apparatus with heater as claimed in claim 8, wherein the first reference line is a tangent line passing through the first joint, and an angle between the first reference line and the first connecting line is larger than or equal to 90 degrees.

10. The MEMS apparatus with heater as claimed in claim 8, wherein the first joint is disposed at a position on a boundary of the central part, wherein the position has a minimum displacement when the central part is not connected with the first connecting part and the central part is heated.

11. The MEMS apparatus with heater as claimed in claim 10, wherein the first connecting part further comprises an inner side and an outer side, and a length of the inner side is greater than a length of the outer side.

12. The MEMS apparatus with heater as claimed in claim 11, further comprising:
    a second connecting part, connecting the second joint and the periphery part;
    wherein the central part further comprises a second joint located on the boundary of the central part, and a line connecting the first joint and the second joint passes through the center of mass.

13. The MEMS apparatus with heater as claimed in claim 8, further comprising:

a second connecting part and a third connecting part;

wherein the central part further comprises a second joint located on the boundary of the central part and a third joint located on the boundary of the central part, the second connecting part connects the central part and the periphery part along a second reference line, the second connecting part comprises a second inner connecting portion and a second outer connecting portion, the second inner connecting portion is connected to the second joint, the second outer connecting portion is connected to the periphery part, the third connecting part connects the central part and the periphery part along a third reference line, the third connecting part comprises a third inner connecting portion and a third outer connecting portion, the third inner connecting portion is connected to the third joint, the third outer connecting portion is connected to the periphery part, the first connecting line, a second connecting line connecting the second joint and the center of mass and a third connecting line connecting the third joint and the center of mass are not aligned.

14. The MEMS apparatus with heater as claimed in claim 8, further comprising:

a second connecting part, a third connecting part and a fourth connecting part;

wherein the central part further comprises a second joint located on the boundary, the third connecting part connects the central part and the periphery part along the first reference line, the third connecting part comprises a third inner connecting portion and a third outer connecting portion, the third inner connecting portion is connected to the first joint, the third outer connecting portion is connected to the periphery part, the second connecting part connects the central part and the periphery part along a second reference line and the fourth connecting part connects the central part and the periphery part along the second reference line, the second connecting part comprises a second inner connecting portion and a second outer connecting portion, the second inner connecting portion is connected to the second joint, the second outer connecting portion is connected to the periphery part, the fourth connecting part comprises a fourth inner connecting part and a fourth outer connecting part, the fourth inner connecting part is connected to the second joint, and the fourth outer connecting part is connected to the periphery part.

* * * * *